United States Patent [19]
Kuo

[11] Patent Number: 5,946,562
[45] Date of Patent: *Aug. 31, 1999

[54] POLYSILICON THIN FILM TRANSISTORS WITH LASER-INDUCED SOLID PHASE CRYSTALLIZED POLYSILICON CHANNEL

[75] Inventor: Yue Kuo, Chappaqua, N.Y.

[73] Assignee: International Business Machines Corporation, Armonk, N.Y.

[*] Notice: This patent is subject to a terminal disclaimer.

[21] Appl. No.: 08/903,639

[22] Filed: Jul. 31, 1997

Related U.S. Application Data

[63] Continuation-in-part of application No. 08/685,728, Jul. 24, 1996, Pat. No. 5,773,329.

[51] Int. Cl.$^6$ .................................................. H01L 21/268
[52] U.S. Cl. ................................... 438/166; 438/162
[58] Field of Search ........................ 438/162, 166, 438/308, 486, 487, 795, 455, 155, 153, 183, 184, 200, 201, 334

[56] References Cited

U.S. PATENT DOCUMENTS

| | | | |
|---|---|---|---|
| 4,358,326 | 11/1982 | Doo | 148/174 |
| 4,670,088 | 6/1987 | Tsaur et al. | 156/617 R |
| 5,231,297 | 7/1993 | Nakayama et al. | 257/77 |
| 5,290,712 | 3/1994 | Sato et al. | 437/24 |
| 5,318,919 | 6/1994 | Noguchi et al. | 437/41 |
| 5,344,796 | 9/1994 | Shin et al. | 437/233 |
| 5,403,772 | 4/1995 | Zhang et al. | 437/101 |
| 5,424,230 | 6/1995 | Wakai | 437/40 |
| 5,444,302 | 8/1995 | Nakajima et al. | 257/755 |
| 5,470,619 | 11/1995 | Ahn et al. | 427/578 |
| 5,488,000 | 1/1996 | Zhang et al. | 437/21 |
| 5,498,904 | 3/1996 | Harata et al. | 257/62.3 |
| 5,531,182 | 7/1996 | Yonehara | 117/7 |
| 5,639,698 | 6/1997 | Yamzaki et al. | 438/162 |
| 5,643,826 | 7/1997 | Ohtani et al. | 438/162 |
| 5,773,329 | 6/1998 | Kuo . | |

FOREIGN PATENT DOCUMENTS

| | | |
|---|---|---|
| 84200154 | 9/1984 | Japan . |
| 85258625 | 11/1985 | Japan . |
| 87178738 | 7/1987 | Japan . |
| 88147295 | 6/1988 | Japan . |
| 88280757 | 11/1988 | Japan . |
| 896435 | 1/1989 | Japan . |
| 8967962 | 3/1989 | Japan . |
| 89144972 | 6/1989 | Japan . |
| 90172108 | 6/1990 | Japan . |
| 90213145 | 8/1990 | Japan . |
| 90245736 | 9/1990 | Japan . |
| 92145747 | 6/1992 | Japan . |

*Primary Examiner*—Charles Bowers
*Assistant Examiner*—Martin Sulsky
*Attorney, Agent, or Firm*—Jay P. Sbrollini

[57] ABSTRACT

Polysilicon thin film transistors (TFTs) are formed on glass substrates by selectively etching a dielectric layer to expose portions of an amorphous silicon layer in areas of the substrate occupied by the thin film transistor forming a metal seed layer over the exposed portions of the amorphous silicon layer; and selectively annealing the exposed areas with a laser beam to transform the amorphous silicon layer to a polysilicon layer.

18 Claims, 11 Drawing Sheets

POLYSILICON THIN FILM TRANSISTORS WITH LASER-INDUCED SOLID PHASE CRYSTALLIZED POLYSILICON CHANNEL

This application is a continuation in part of application Ser. No. 08/685,728 filed Jul. 24, 1996 of the entitled "Polysilicon Grown by Pulsed Rapid Thermal Annealing", now U.S. Pat. No. 5,773,329.

BACKGROUND OF THE INVENTION

1. Field of the Invention

The present invention is directed to a method for rapidly forming polysilicon from amorphous silicon, and more particularly, to using lasers to form crystallized polysilicon channels for thin film transistors.

2. Discussion of the Prior Art

Thin film transistors (TFTs) are critical for high performance liquid crystal display (LCD), which are one of the most important components for laptop computers. TFTs are also applied to other two dimensional (2D) imagers, sensors, and electronic equipment. Currently, most large area arrays of TFTs are based on amorphous materials, such as a hydrogen amorphous silicon a-Si:H. However, a-Si:H TFT has some intrinsic drawbacks, e.g., low mobility and high photosensitivity. Therefore, several extra process steps have to be added to the manufacturing procedure to avoid, or compensate for, these problems. For example, a black matrix has to be used to block light from reaching the TFTs. Drivers for a display have to be fabricated separately from the TFTs of the array.

To avoid the problems associated with a-Si:H based TFTs, polysilicon TFTs are used. One of the major drawbacks of a polysilicon TFT is high leakage current. Proper design of the polysilicon TFT structure minimizes the leakage current. Display panel fabrication procedure is simplified and cost is reduced where all the driver circuits are integrated into the pixel TFT fabrication process. However, a major problem in fabricating polysilicon TFTs is the formation of polysilicon under certain conditions which include:

1) a low temperature, such as less than 550° C. on a low temperature glass;
2) on a large piece of glass substrate; and
3) with a high throughput.

Therefore, high temperature processes, such as annealing at 700° C., are not suitable for low temperature glass. Several methods, including laser crystallization, furnace annealing and reactive chemical vapor deposition have been reported for the preparation of polysilicon. These methods require either high temperature or a long process time. In some cases, uniformity over a large area is difficult to achieve. Therefore, using conventional methods, high quality polysilicon cannot be formed in an efficient manner.

The use of laser annealing to supply polysilicon with low defect densities within grains is disclosed in the following references:

1. A. Kohno, T. Sameshima, N. Sano, M. Sekiya, and M. Hara, IEEE Trans. Electron Devices 42 (2), 251 (1995); and
2. H. Tanabe, K. Sera, K, Nakamura, K. Hirata, K. Yuda and F. Okumura, NEC Res. & Dev. 35 (3), 254 (1994).

Laser polysiliconization is popular because it produces high mobility TFTs. However, laser annealing has drawbacks. One approach would be to scan the entire amorphous silicon layer with a laser beam since the laser beams used for this purpose are usually small, e.g., less than 1 cm by 1 cm, and it takes a long time to scan through the whole area of a large display substrate. Further, even if a large field laser is used, the crystallization process is tedious. The laser beam spot is not uniform across its diameter. To compensate for this nonuniformity, complicated beam overlap procedures have to be used to obtain uniformity of the polysilicon structure. Another approach would be to selectively crystallize only those areas of the amorphous silicon film to be occupied by the TFTs. However, later alignment of the TFT structure on the polysilicon areas would be critical.

Another polysilicon crystallization method is to use a low-temperature, e.g., 600° C., furnace annealing to crystallize silicon. Such a method is discussed in the following reference, which is incorporated herein by reference:

3. K. Ono, S. Oikawa, N. Konishi, and K. Miyata, JPN. J. Appl. Phys. 29, 2705 (1990).

There are reports on direct deposition of polycrystalline or microcrystalline silicon films at temperatures lower than 500° C. by adding hydrogen-, fluorine-, or chlorine-containing gases to the silicon source in a chemical vapor deposition (CVD) process. Most of the films formed by such a reactive CVD process have a columnar structure with rough topography. It is difficult to obtain a good polysilicon film uniformity over a large substrate area with this kind of reactive CVD. Thus, highly reactive CVD processes have not provided good quality polysilicon film over a large area.

The following references discuss polysilicon formation processes:

4. M. Bonnel, N. Duhamel, M. Guendouz, L. Haji, B. Loisel, and P,. Ruault, Jpn. N. Appl. Phys. 30 (1B), L 1924 (1991);
5. G. Liu and S. J. Fonash, Appl. Phys. Lett. 62, 22554 (1993); and
6. S. W. Lee, Y. C. Jeon, and S. K. Joo, ECS Proceedings of 2nd Thin Film Transistor Technologies, edited by Y. Kuo. (Electrochemical Society, Pennington, N.J. (1994), Vol. 94-35, p. 115).

When a proper metal is in contact with the original amorphous silicon, both the temperature and the time of the crystallization can be shortened. For example, the Bonnel, et al. reference showed that polysilicon could be formed in 40 seconds at 750° C. when the amorphous silicon was in contact with indium tin oxide (ITO). The Liu et al. reference reported that when a thin layer, i.e., 40 Å, of palladium (Pd) was deposited underneath an amorphous silicon, the crystallization could be carried out in 2 hours at 600° C. The Lee et al. reference demonstrated that silicon could be crystallized laterally from the Pd contact area. Although the growth temperature was low, i.e., 500° C., it took 10 hours to fully crystallize an area of 100 micrometers by 100 micrometers.

These conventional processes are not practical for the mass production of TFTs on a low temperature glass, such as Corning 7059, because either the temperature is too high or the process time is too long.

In the above mentioned U.S. patent application, Ser. No. 08/685,728, filed Jul. 24, 1996 (IBM Docket #Y09-96-092), by the inventor of the present application, rapid silicon crystallization and rapid transformation of amorphous silicon to polysilicon is accomplished by a pulsed rapid thermal annealing (PRTA) method performed on partially fabricated TFTs having a layered metal-silicon structure, where the metal of the structure acts as a seed layer to transform the amorphous silicon to polysilicon. The PRTA method subjects the TFT to relatively high temperature pulses of short duration to obtain silicide at the metal silicon interface. As the high temperature pulses continue, there is a rapid transformation of the amorphous silicon to polysilicon that spreads out from the silicide without causing irreparable damage to low temperature glass of the TFT substrate.

While this technique has proven to be effective, it simultaneously subjects the whole substrate to the high temperature pulses which requires the process to be controlled to provide acceptable results both at the center and around the periphery of the substrate containing the TFTs.

SUMMARY OF THE INVENTION

In accordance with the present invention, a short wavelength laser, such as a XeCl eximer laser, is used to irradiate one or more of partially or completely fabricated TFTs formed on a glass substrate. The glass substrate contains a metal seed layer over an amorphous silicon layer with exposed portions defining the TFT locations. As the laser beam irradiates each TFT location, its energy is absorbed by the seed metal layer and the top thin portion of the amorphous silicon layer. This forms silicide in the seed metal/silicon interface in the TFT areas, and heats up the amorphous silicon. Since the heating is localized in the top portion of the amorphous silicon film, the film temperature can be very high without melting the amorphous silicon, or having a deleterious effect on the glass substrate. Because of the high temperature, radial solid-phase transformation of amorphous to polycrystalline silicon proceeds rapidly from the silicide areas. Once the laser annealing is finished, the TFT structure is complete or can be completed using known techniques. In self-aligned TFT structures, the polysilicon channel areas are aligned with the gate areas and the surrounding drain and source areas of the TFTs. Further, the length of exposure and the number of irradiations by the laser can be varied from one TFT to another to accommodate differences in structure and localized conditions.

Therefore it is an object of the present invention to provide a method of forming polysilicon that eliminates the problems of conventional methods.

Another object of the present invention is to quickly form polysilicon from amorphous silicon without going through the solid-liquid-solid phase transition.

Yet another object of the present invention is to form polysilicon on a low temperature substrate.

A further object of the present invention is to form polysilicon thin film transistors (TFTs) with a high throughput, on low temperature, large area, glass substrates.

BRIEF DESCRIPTION OF THE DRAWINGS

These and other objects, features and advantages of the invention will become more readily apparent from a consideration of the following detailed description set forth with reference to the accompanying drawings, which specify and show preferred embodiments of the invention of which.

DETAILED DESCRIPTION OF THE INVENTION

Figure 1A:
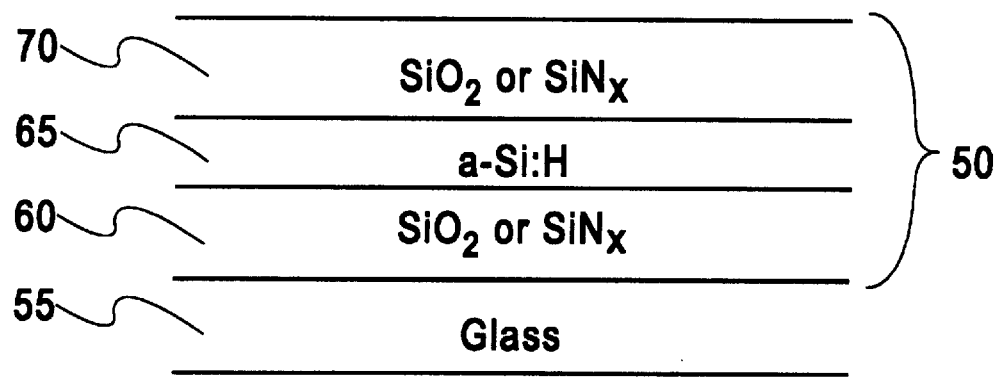
FIGS. 1a–1i show a laser induced solid-phase polycrystalline silicon growth process in accordance with the present invention.

As shown in FIG. 1a, a 3-layer structure 50 is formed on a low temperature glass 55, using, for example, 250° C. plasma enhanced chemical vapor deposition (PECVD). Such a process is described in the following reference, which is incorporated herein by reference:

8. Y. Kuo, Appl. Phys. Lett. 67, 2173 (1995).

Illustratively, the low temperature glass 55 is a Corning 7059 glass, and the trilayer structure 50 is $SiN_x$ or $SiO_x$/a-Si:H/$SiN_x$ or $SiO_2$ having thicknesses of 2000 Å/600 Å/1000 Å, respectively. These layers are referenced as 60, 65, 70, respectively in FIG. 1a. Other dielectric material, such as other oxides of silicon $SiO_x$ or tantalum $Ta_2O_5$, or aluminum, $Al_2O_3$, may be used instead of the bottom and top $SiN_x$ layers 60, 70. The middle layer 65, which is sandwiched between the two dielectric layers 60, 70 is a hydrogenated amorphous silicon a-Si:H layer.

Figure 1B:
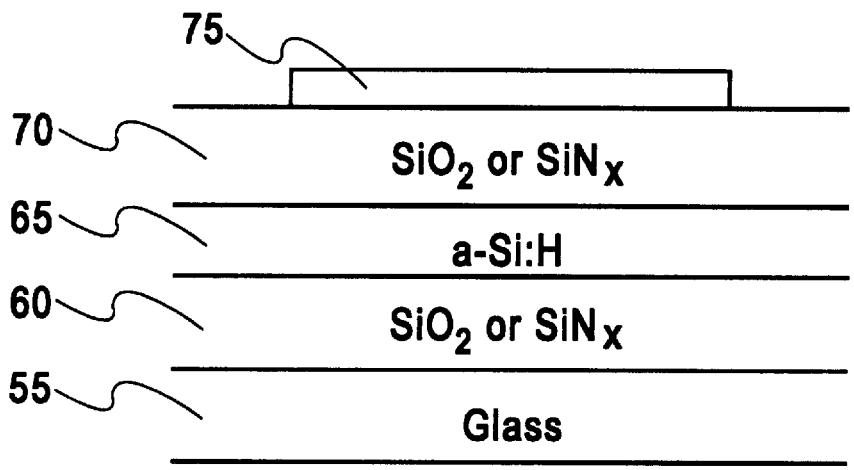
Figure 1C:
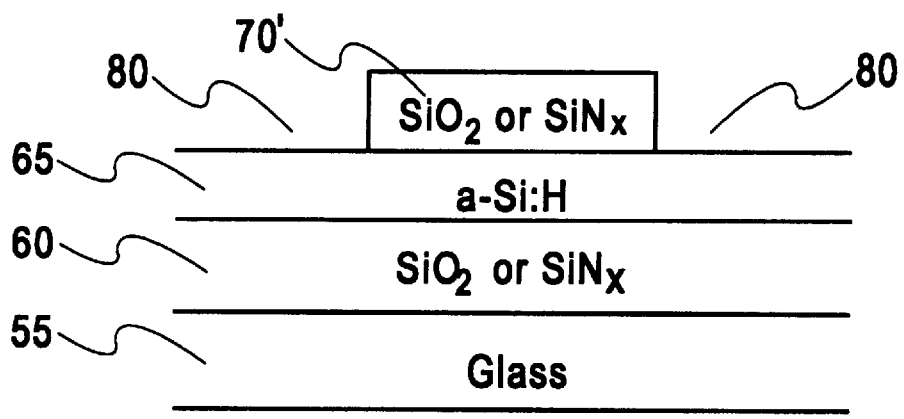

As shown in FIG. 1b, a first mask 75 is formed over the top dielectric layer 70, which is etched to expose portions 80 of the amorphous silicon layer 65 as shown in FIG. 2c. Etching the top dielectric layer 70 forms a top dielectric section 70'. Conventional etching solutions may be used to expose the portions 80 and form the top dielectric section 70'. The mask 75 is removed upon completion of the etching. At this state, an optional annealing of the structure shown in FIG. 2c may be performed to remove hydrogen from films 70', 65° and 60. Illustratively, this annealing is performed at 500° C., for approximately 1 hour. The annealing step can also be applied at the beginning of the process, i.e., FIG. 1a.

Figure 1D:
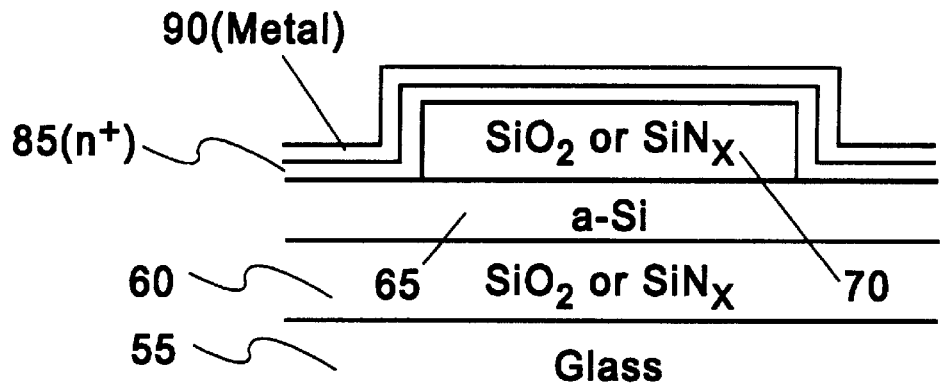

As shown in FIG. 1d, a heavily doped layer 85 of silicon is formed over the top dielectric section 70' and exposed portions of the amorphous silicon layer 65. Illustratively, this silicon layer 85 is deposited using a PECVD process and doped with phosphorus to form $n^+$ Si layer 85. Alternatively, the PECVD $n^+$ deposition step may be replaced by an ion implantation or a non-mass-separation ion shower implantation step. The thickness of the heavily doped layer 85 is 250 Å, for example. Next, a seed metal layer 90 is deposited over the heavily doped layer 85. For example, the seed metal layer 90 has a thickness of 100 Å and is nickel (Ni), titanium (Ti) or palladium (Pd). Alternatively, the heavily doped layer 95 may be omitted, and the metal layer 90 may be formed directly over the amorphous silicon layer 65. An advantage of having the heavily doped layer 85 is for formation of ohmic contacts which are important for the high performance transistor. Another advantage of having the heavily doped layer 85 includes enhanced silicide formation in the heavily doped layer 85 under raised temperature. As pointed out above, silicide acts as a seed layer for polysilicon growth or transformation of the amorphous silicon layer 65 to a polysilicon layer as described below.

Figure 1E:
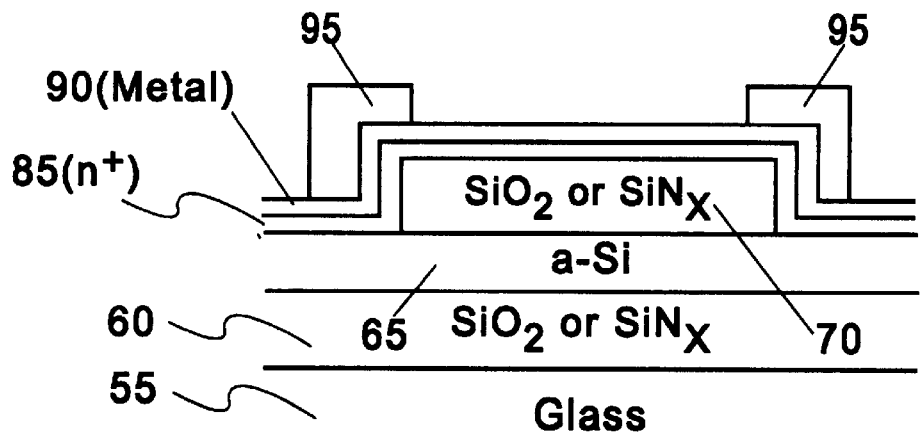

As shown in FIG. 1e, a second mask 95, such as a photoresist, is applied to define the metal area. Portions of the metal layer 90 not covered by the second mask 95 are etched. In addition, regions of the $n^+$ and silicon layers 85, 65, not covered by the metal layer 90 or the top dielectric section 70', are etched, e.g., by reactive ion etching (RIE), using the same second mask 95. Such an RIE process is described in the following reference, which is incorporated herein by reference:

9. Y. Kuo, J. Electrochem. Soc. 139,548 (1992).

Figure 1F:
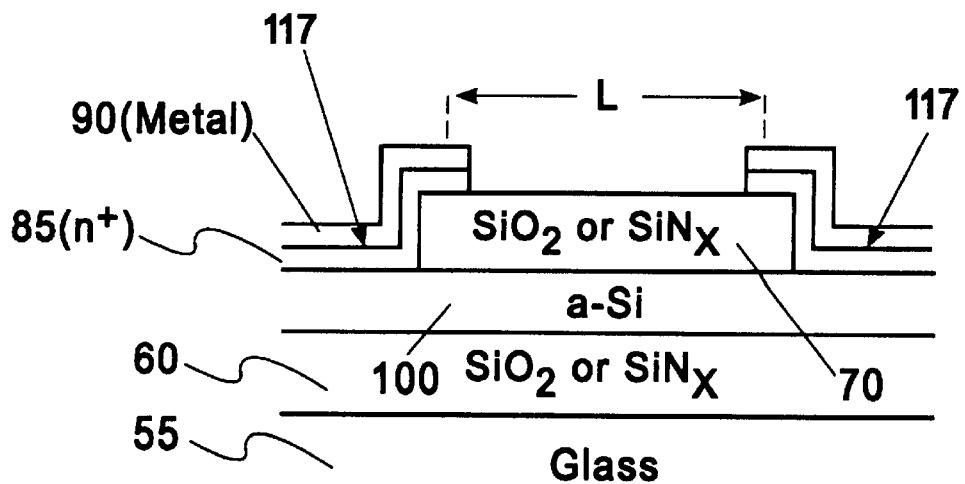

As shown in FIG. 1f, the second mask 95 is removed. The silicon etching by the RIE step forms as amorphous silicon island 100 from the amorphous silicon layer 65. This island 100 contains the channel area for the TFT. Illustratively, the channel length L is between 2 $\mu$m and 10 $\mu$m, and the channel width W (not shown) is 3 $\mu$m and 30 $\mu$m.

Next, a thermal annealing step may be performed to dehydrogenate the $n^+$ layer 85, the amorphous silicon island 100, and the $S_iN_x$ or $S_iO_2$ layers 70 and 60. Illustratively, the annealing is performed at approximately 500° C. for about 2 or 3 hours.

Figure 1G:
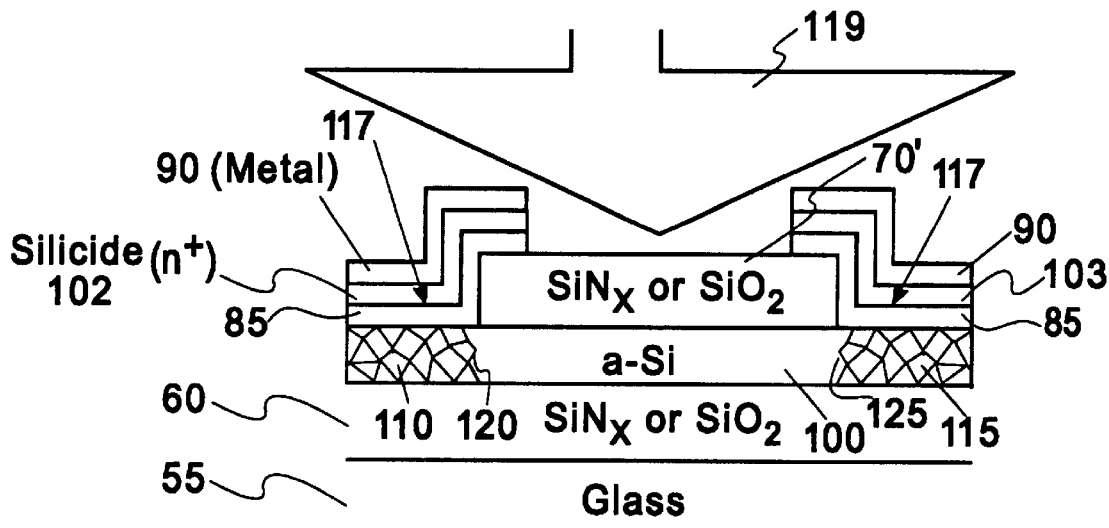

After annealing, the semiconductor device is exposed to a laser beam 119 of a short wavelength such as a XeCl eximer laser, as shown in FIG. 1g. The laser energy is absorbed in the metal layer and top thin layer (for example, 100 angstroms) of the amorphous silicon layer 100 heating that area to not more than the melting point of amorphous silicon (approximately 1000°) preferably 700° to 900°0 C. When the laser irradiates the channel and top metal areas, silicide regions 102, 103 are formed by consuming some of the metal and amorphous silicon layers 90 and 85. In addition, as FIG. 1g shows two polysilicon regions 110, 115 are formed in the amorphous silicon island 100 underneath the silicide regions 102, 103.

These new polysilicon regions 110, 115 start from silicide areas 102, 103 shown in FIG. 1g. Since the n+ layer can be formed inside the exposed amorphous silicon layer 100 when an ion implantation method is used, the silicide layer can also be formed within the silicon layer. The same patterns can occur even without the $n^+$ layer 85 (FIG. 1f) between the metal and silicon layers 90, 100.

Figure 1H:
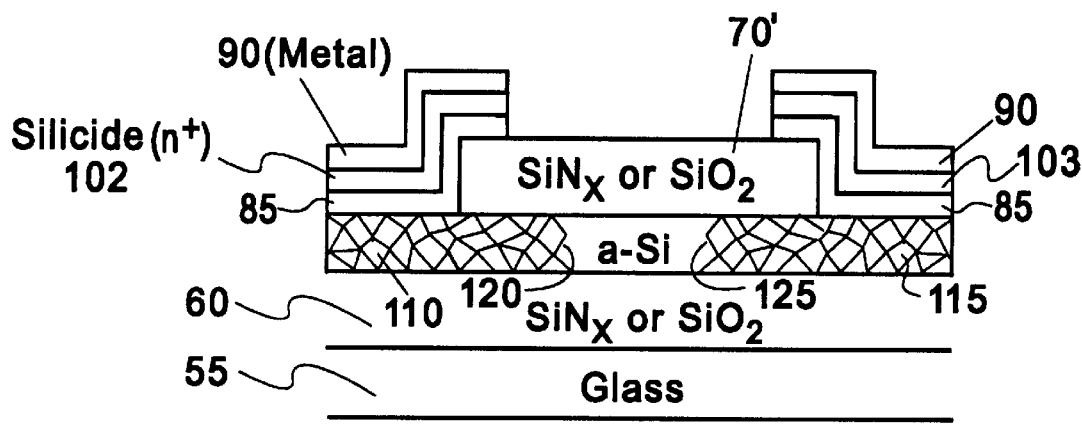
Figure 1I:
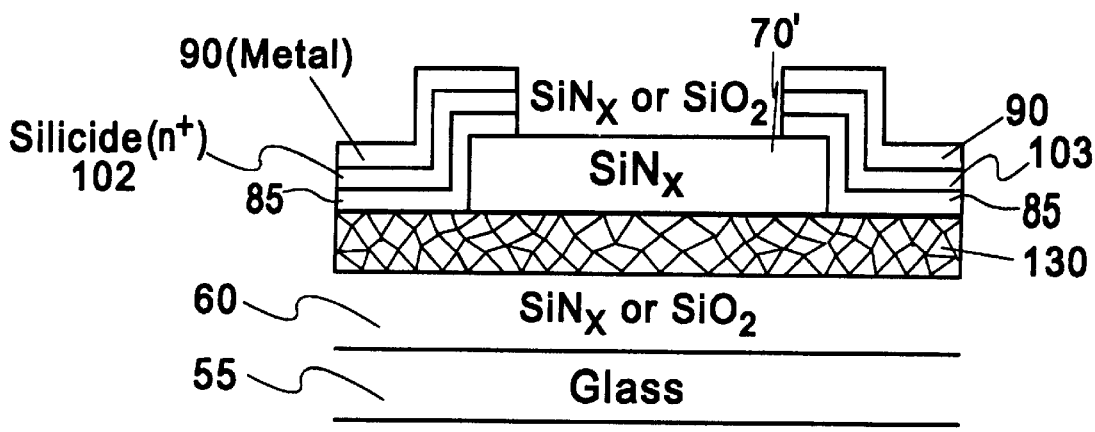

As shown in FIG. 1h, boundaries 120, 125 of the two polysilicon regions 110, 115 move toward the center of the amorphous silicon island 100 as additional laser irradiations are applied. As shown in FIGS. 1h and 1i, the two polysilicon regions 110, 115 grow laterally to eventually merge. This transforms the amorphous silicon to polysilicon and forms a polysilicon island 130, shown in FIG. 1i.

It is noteworthy that the amorphous silicon island 100 need not be totally crystallized and transformed to the polysilicon island 130. A small amorphous silicon region in the center of the polysilicon island 130 also confines the leakage current to low levels.

Figure 2:
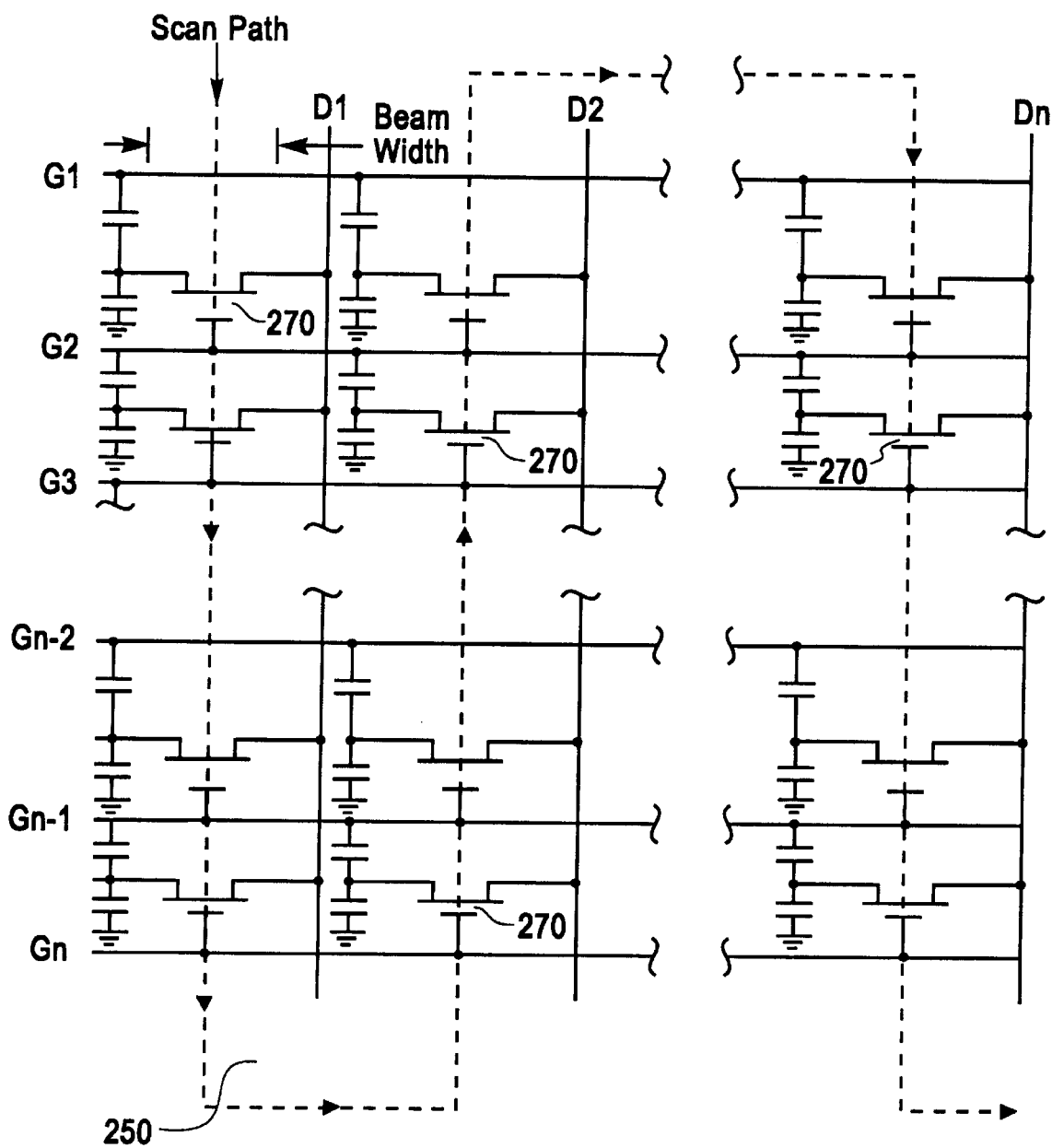
FIG. 2 shows a scanning path of a substrate with a laser to form a large array of polysilicon TFTs in accordance with the present invention.

The resistivity of the polysilicon channel structure is affected by several factors: the metal/$n^+$ contact 90, 85 quality (FIG. 1f); the polysilicon 130 grain size and quality in the channel area; and the polysilicon to $SiN_x$ 70' interfaces. The laser exposure causes silicide formation, initializes transformation for amorphous silicon to polysilicon, and facilitates lateral growth of polysilicon. FIG. 2 shows an example of the laser scan path 250 relative to the TFT structure on a glass substrate. (The scans are illustrated as being over completed TFTs for illustrative purposes. However, scanning can also be performed over partially fabricated TFT as shown in FIGS. 1a to 1i.) This path is over the exposed channel regions of the TFTs. Only those channel regions and surrounds are exposed. Since the TFT formation process is self aligning and the laser spot is usually larger than the TFT channel region (e.g., 800 $\mu$x800 $\mu$ laser spot size vs 5 $\mu$x10 $\mu$ channel area) there is no need of the highly accurate alignment of the laser with the intended portions of the channels. Nor is the need to crystalize the whole film with a complicated beam overlap process to compensate for nonuniformity of the beam across the beams width. The position of the gates of the TFTs on the substrate have already been defined by the previous steps of the fabrication process. Only those channel areas and surrounds of the film need be exposed to the laser energy. In addition to the conventional small spot eximer laser (e.g., <800 $\mu$x800 $\mu$), the large field laser (e.g., 4"x4" of Sopra S.A., Laser) allows the exposure of a large number of TFTs at one time so that a large array of TFTs can be crystallized with a few exposures.

Figure 3:
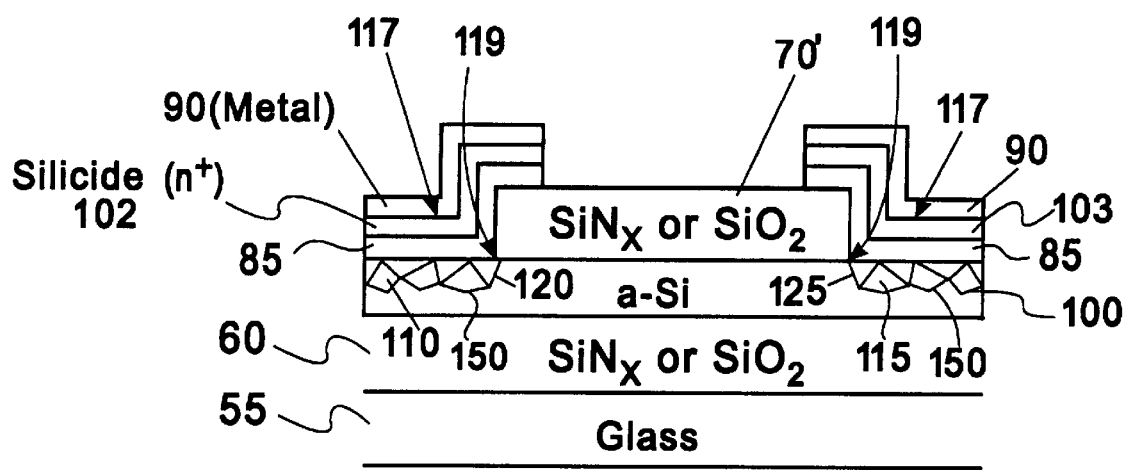
FIG. 3 shows a detailed view of one of the steps shown in FIGS. 1a–1i in accordance with the present invention.

FIG. 3 shows formation of the silicide regions 102, 103 and the initial transformation resulting from the early stage of the laser exposure of the present process, leading to the structure shown in FIG. 1g. Subsequent exposures cause lateral growth of the polysilicon regions 120, 125, also shown in FIG. 1h, to eventually form the polysilicon island 130 shown in FIG. 1i.

After the first exposure of a multiexposure procedure, the frontiers 120, 125 of the polysilicon zones 110, 115 move toward the center of the a-Si island 100, away from an metal/$n^+$ contact at the edge 119 of the $SiN_x$ section 70'. Therefore, the short period of high temperature, i.e., 900° C. in this process accomplishes silicide formation and initialization of silicon crystallization, in addition to the growth for polysilicon into the island area 100. Additional exposures in the multi-exposure procedure mainly contribute to the growth of the polysilicon in the island area 100.

The silicide film 102 is usually in polycrystalline form, which serves as the seed to initiate the crystallization of silicon. The silicide reaction is material and temperature dependent. For example when titanium (Ti) is used as the seed layer, thin polysilicon zone frontiers 120, 125 (FIG. 1h) extend slower than when Ni is used as the seed layer. In another example, if the glass substrate is heated, the crystallization speed will be faster than at room temperature.

Figure 4:
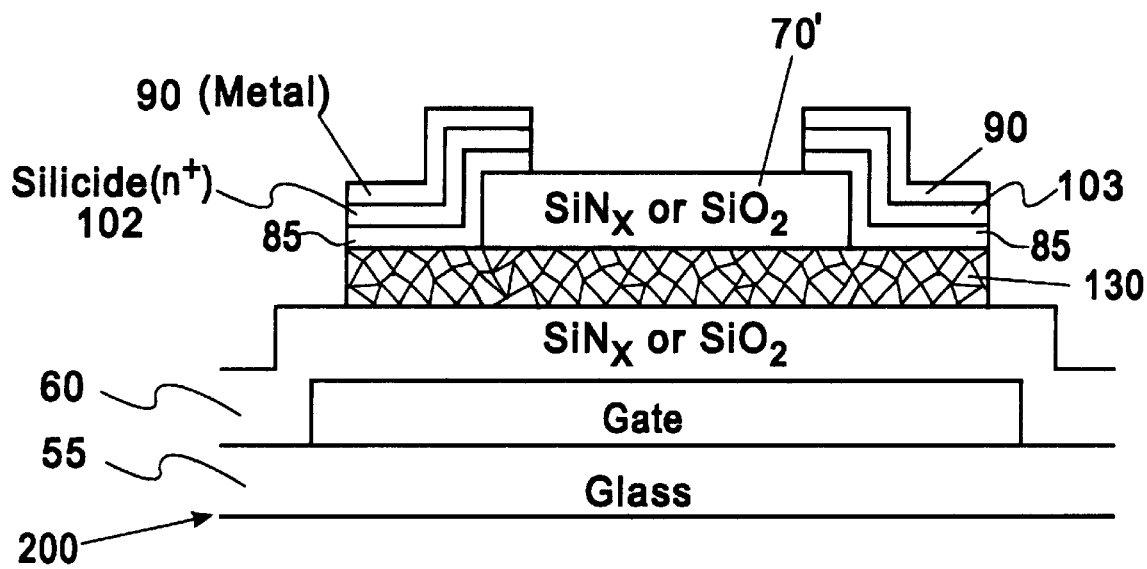
FIG. 4 shows a bottom gate polysilicon thin film transistor formed in accordance with the present invention.

The structure shown in FIG. 1i can be used to fabricate TFTs with either a bottom or a top gate structure. FIG. 4 shows a bottom gate polysilicon TFT device 200 having a gate 205 located over the glass layer 55. The bottom gate polysilicon TFT device 200 is fabricated by forming a metal gate layer over the glass layer 55 prior to the deposition of the tri-layer 50 described in connection with FIG. 1a.

This metal gate layer is selectively etched to form the gate 205 using conventional photolithography, i.e., by masking with a photoresist and etching. The remaining steps in the formation of the bottom gate polysilicon TFT device 200 are identical to then steps described above leading in connection with FIGS. 1b–1i.

The silicide regions 102, 103 act as the source and drain regions, respectively. The channel of the TFT is included in the polysilicon island 130.

Figure 5:
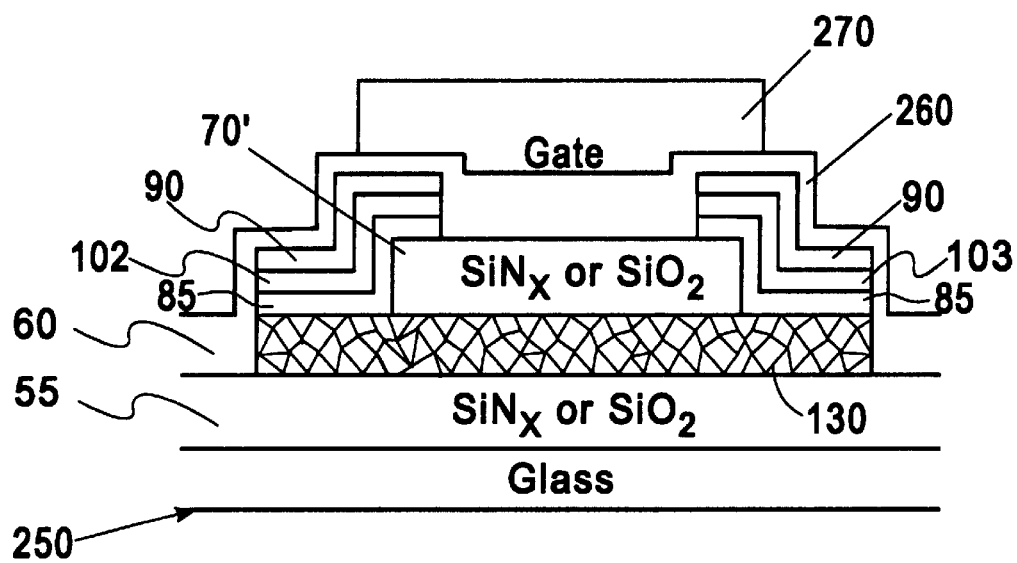
FIG. 5 shows a top gate polysilicon thin film transistor formed in accordance with the present invention.

FIG. 5 shows a top gate polysilicon TFT device 250 which is fabricated using the steps described in connection with FIGS. 1a–1i. In addition, the following steps are performed. A layer of insulating material 260 is formed over the structure shown in FIG. 1i. Illustratively, the insulating material 260 is silicon oxide or silicon nitride. Next, a metal gate layer is formed and selectively etched, e.g., via conventional photolithographic steps, to form a top gate 270. An optional step is to etch part of the dielectric layer 260 using the same mask used for patterning the top gate 270. Etching part of the dielectric layer 260 exposes both source and drain metals. This allows all three TFT electrodes, i.e., gate, source and drain, to be probed at the same time.

The metal gate layer used to form the top or bottom gates 270, 205 may be the same or a different metal as the top metal layer 90. In addition, the gate layer can be a heavily doped silicon film. The bottom and top gate polysilicon TFT devices 200, 250 of FIGS. 4 and 5 are self-aligned.

After forming the bottom or top gate polysilicon TFT devices 200, 205, another annealing step may be performed if desired. This annealing step repairs any leakage current in the polysilicon TFTs, and may be a plasma hydrogen annealing step, for example.

Figure 6A:
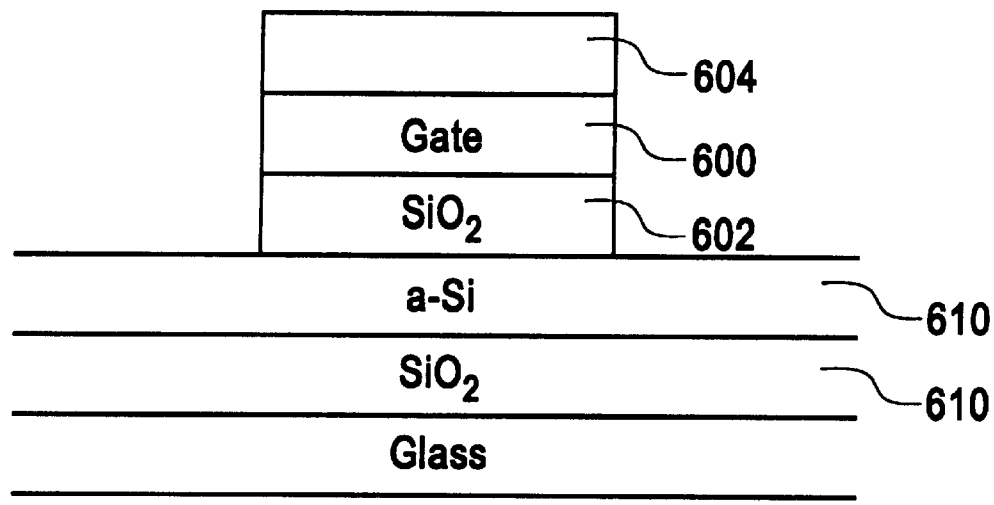
FIGS. 6a–6f shows a co-planar polysilicon thin film transistor formed in accordance with another embodiment of the present invention.
Figure 6B:
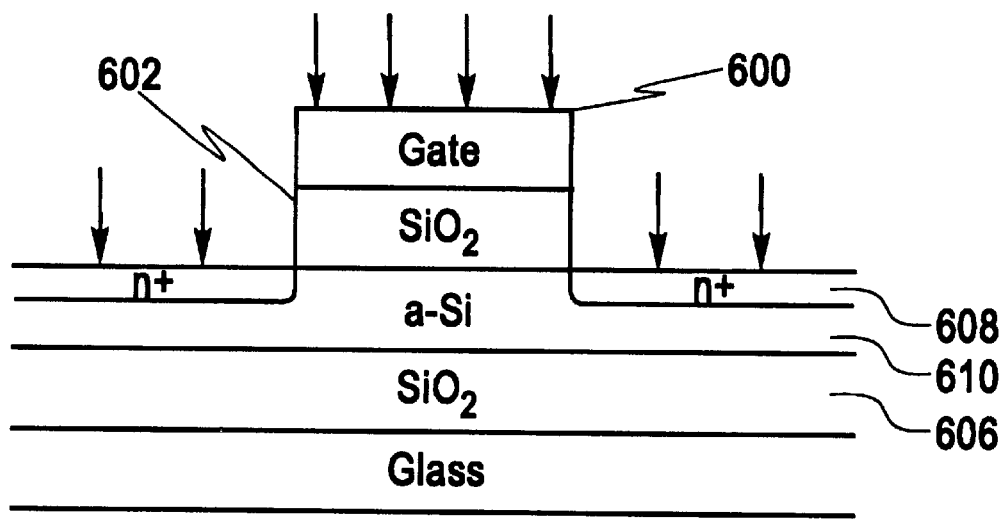
Figure 6C:
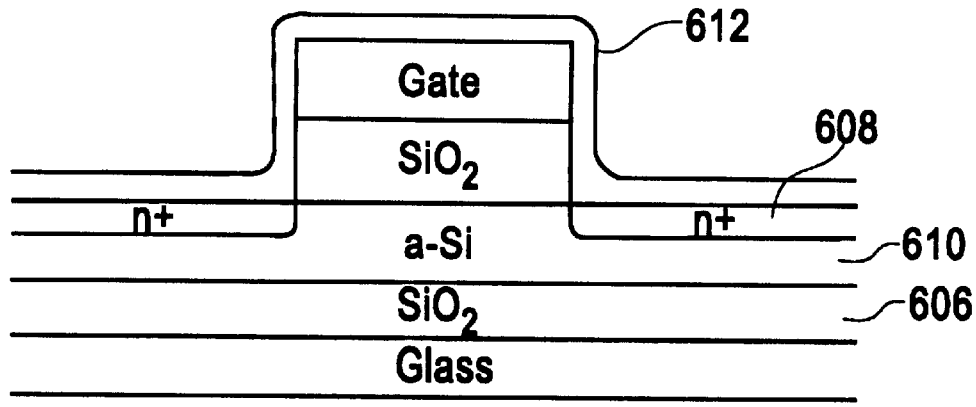
Figure 6D:
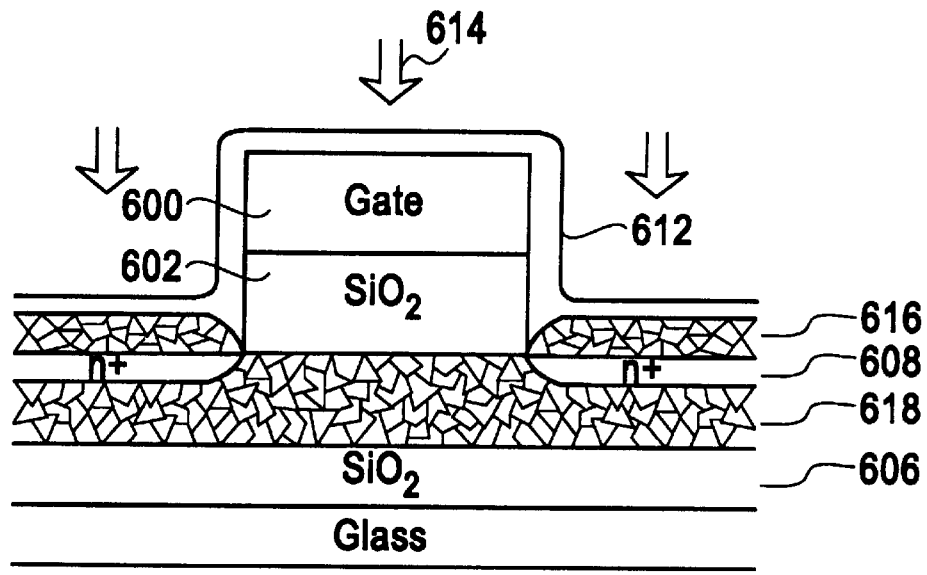
Figure 6E:
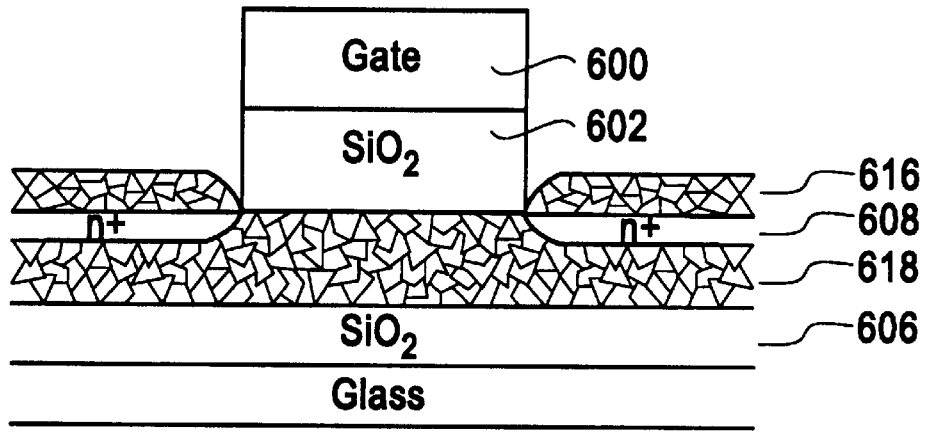
Figure 6F:
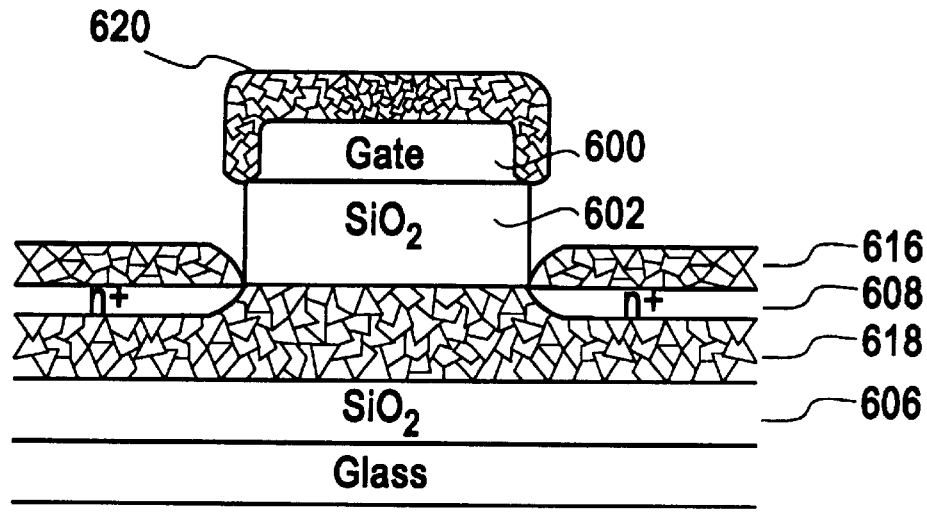

Another embodiment is shown in FIGS. 6a–6f. In FIG. 6a, a multilayer ($SiO_2$/a-$S_1$/$S_iO_2$/gate) structure is deposited on a glass substrate. One mask is used to define gate 600 and a $SiO_2$ layer 602. After etching of the gate and $SiO_2$, the photoresist 604 is stripped off. The gate material can be a metal or a heavily doped silicon such as n+ layer. The bottom S $SiO_2$ layer 606 is an optional layer. As shown in FIG. 6b, the device is implanted by ion implantation with n-type dopant 608 such as phosphorus. The implantation method can be a conventional ion implantation as shown, or a non-mass separation ion implantation. The substrate can be kept at room temperature or a raised temperature, such as 200° C. A thermal annealing step can be used to remove hydrogen from the amorphous silicon and $S_iO_2$ films 610 and 606, if necessary. In FIG. 6c, a thin layer 612 of a metal such as $N_i$, is deposited on the substrate. In FIG. 6d, the structure is exposed to a laser beam, such as that from an XeCl eximer laser using one or several pulses. The temperature of the amorphous silicon film will raise and silicide 616 will be formed at the n+ and metal interface. This silicide layer will consume part of, or the whole of, thin metal layer 612. Also, a polysilicon layer 618 is formed under the n+ layer as described in the previous embodiment. The n+ layer 608 is also crystallized. As shown in FIG. 6e, unreacted thin metal is then removed, e.g., with a wet solution without removing the gate. A second mask can be used to etch and define the source and drain areas (not shown). The TFT structure is then complete. If the gate material is n+ silicon, a silicide layer 620 will be formed on the surface of gate, as shown in FIG. 6f. A second mask is then used to define the source and drain areas (not shown). The resulting device, like that of FIG. 1, has a self-aligning structure.

Figure 7A:
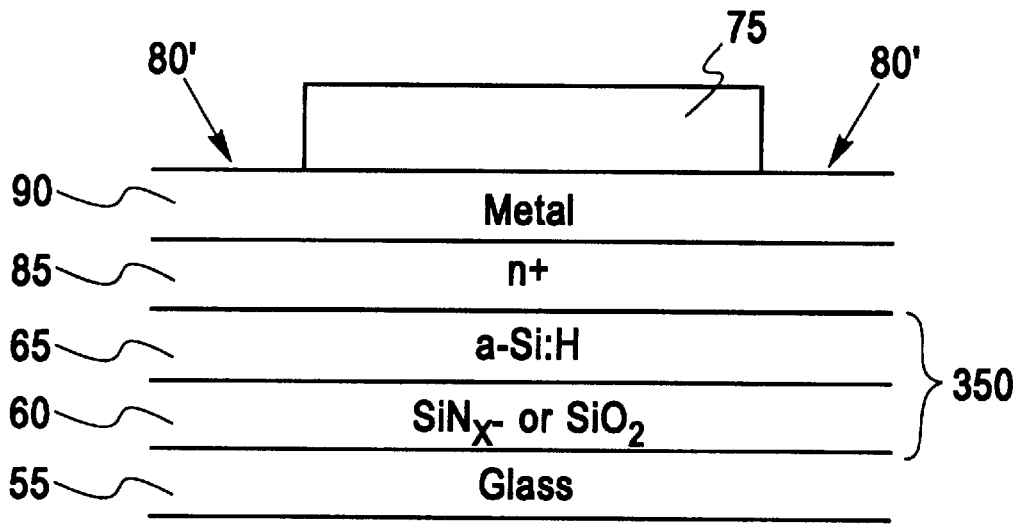
FIGS. 7a–7d show a laser induced thermal annealing process in accordance with another embodiment of the present invention.

FIGS. 7a–7d show an alternate embodiment using laser annealing. The TFT forming method of this embodiment is similar to the method described in connection with FIGS. 1a–1i and FIGS. 2, 4 and 5. As shown in FIG. 7a, instead of forming the tri-layer structure 50 of FIG. 1a, a bi-layer structure 350 is formed over the glass layer 55. The bi-layer structure 350 does not have the top dielectric layer 70 of the tri-layer structure 50 of FIG. 1a.

The bi-layer structure 350 includes dielectric, e.g., $SiN_x$, and hydrogenated amorphous silicon (a-Si:H) layers 60, 65. Next, a heavily doped $n^+$ and metal layers 85, 90 are formed over the a-Si:H layer 65. The $n^+$ layer 85 may be formed using different methods, such as a PECVD deposition method, an ion implantation method, or a non-mass-separation ion shower implantation method. These steps sequentially form the $SiN_x$ 60, a-Si:H 65, $n^+$ 85 and metal 90 layers over the glass substrate. A mask 75 is formed on the metal layer 90 to define the hydrogenated amorphous silicon (a-Si:H) island 100 of FIG. 7b by etching through the metal, $n^+$ and a-Si:H layers 90, 85, 65.

Figure 7B:
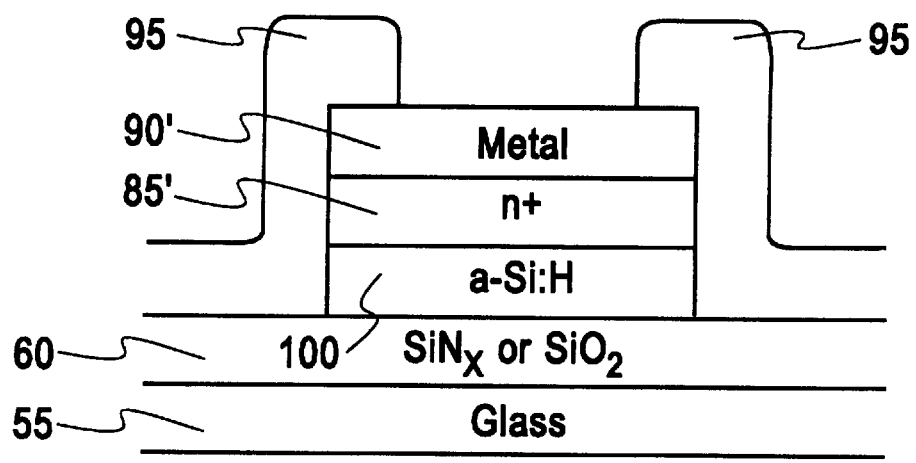

As shown in FIGS. 7a and 7b, portions 80' of the metal, $n^+$ and a-Si:H layers 90, 85, 65 not covered by the mask 75 are etched off. This patterns the metal, $n^+$ and a-Si:H layers 90, 85, 65 and forms metal section 90', $n^+$ section 85', and a-Si:H island 100. Another mask 95 is formed over the exposed $SiN_x$ layer 60 and portions of the metal section 90'.

As shown in FIG. 6c, portions of the metal section 90', and $n^+$ section 85' not covered by the mask 95 are etched to form source and drain regions. The source region includes the source metal 355 and $n^+$ section 102', and the drain region includes the drain metal 360 and $n^+$ section 103'. Thereafter, the mask 95 (FIG. 7b) is removed.

Figure 7C:
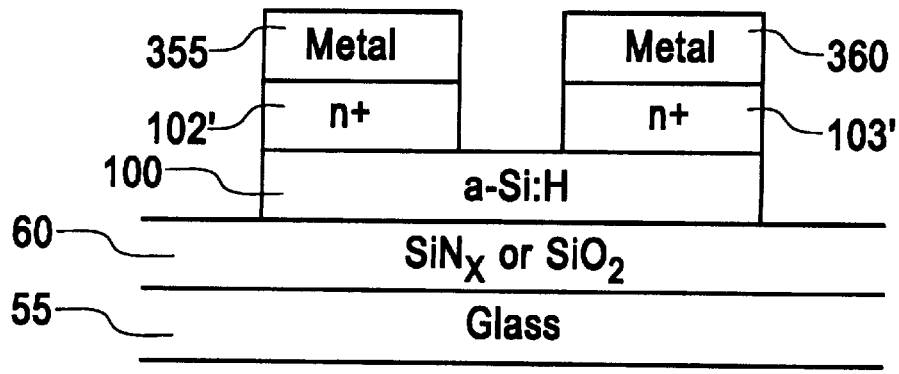
Figure 7D:
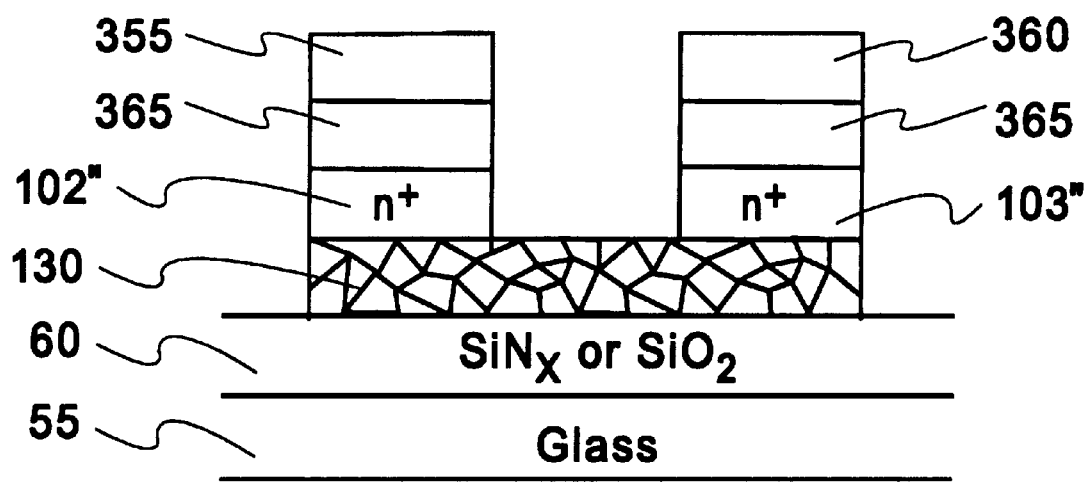

Next, the structure shown in FIG. 7c is annealed in an oven to remove hydrogen from the a-Si:H island 100, $n^+$ sections 102', 103', and $SiN_x$ layer 60. As shown in FIG. 7d, a laser annealing step is performed by laser beam to crystallize the silicon island 100 thus forming the polysilicon island 130. This laser annealing step is described in detail in connection with FIGS. 1g–1i, FIG. 2 and FIG. 4. The laser annealing step also forms silicides layers 365 at the boundaries of the source/drain metals 355, 360 and the $n^+$ regions 102', 103', and even part of the a-Si:H island 100, transform to silicide. In addition, the annealing step crystallizes the $n^+$ regions 102', 103', thus forming polysilicon $n^+$ regions 102'', 103''.

Figure 8:
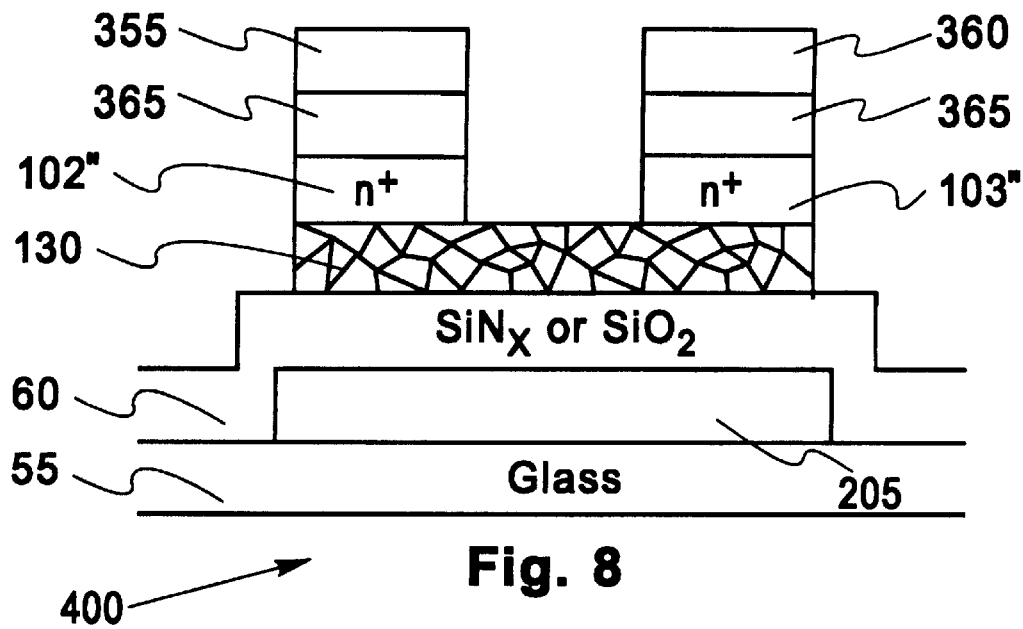
FIG. 8 shows a bottom gate polysilicon thin film transistor formed in accordance with the embodiment of the present invention of FIGS. 7a–7d.

As shown in FIG. 8, a bottom gate polysilicon TFT 400 is fabricated by forming a bottom gate 205 over the substrate 55 before the deposition of the bi-layer 350 of FIG. 7a. Steps similar to those described in detail connection with FIG. 4 are used to form the bottom gate 205.

Figure 9:
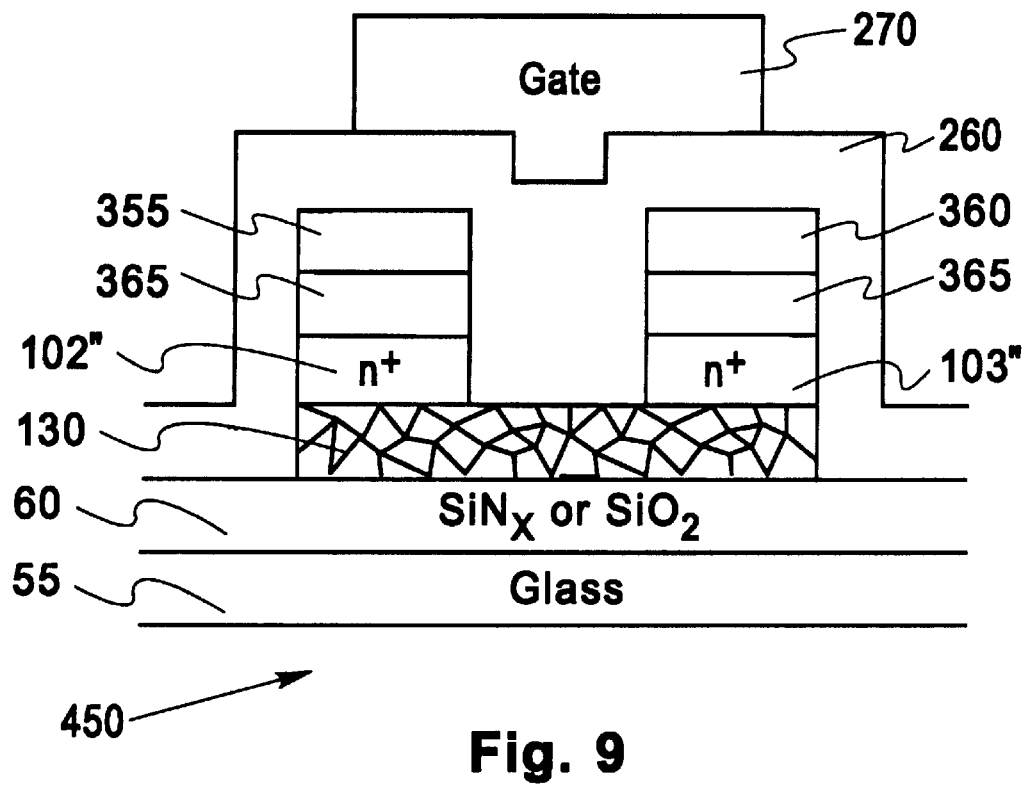
FIG. 9 shows a top gate polysilicon thin film layer transistor formed in accordance with the embodiment of the present invention of FIGS. 7a–7d.

As shown in FIG. 9, a top gate polysilicon TFT 450 is fabricated by forming, over the structure shown in FIG. 7d, an additional dielectric layer 260 followed by a top gate metal layer. Next, the top gate metal layer is patterned, e.g., masked and etched, to form a top metal gate 270. Steps similar to those described in detail connection with FIG. 6 are used to form the top gate 270. An optional step includes etching a portion of the dielectric layer 260 using the same mask as that for etching the top metal gate 270. This exposes both source and drain metals, allowing all three TFT electrodes (i.e., gate, source and drain) to be probed simultaneously.

A plasma hydrogenation step may be used to passivate dangling bonds in the polysilicon layers. This completes the fabrication of the bottom gate or top gate polysilicon TFTs 400, 450.

In summary, the present invention causes rapid crystallization of silicon to form polysilicon from amorphous silicon. The invention uses a laser annealing of an amorphous silicon TFT with a metal source and drain seed layer. This method can be used in fabricating polysilicon thin film transistors (TFTs) on low-temperature, large-area glass substrates with a high throughput.

The present invention is based on the principle of localized high temperature heating cycles used in a controlled way. Polysilicon is grown laterally from the metal-silicon contact region. The lateral length of the polysilicon region increases with the number of laser exposures. Metals, such as Ni, Pd and Ti, may be used as the metal seed layer and as the top or bottom gates. The transformation rate of silicon from amorphous to polycrystalline may depend on the temperature of the substrate.

Since the laser annealing process is controlled by the local heating and their reaction between the seed metal and silicon, it can be applied to prepare small geometry devices without deteriorating the large area uniformity. To obtain good device characteristics, process parameters may be adjusted, such as the laser wavelength, the laser power density, the pulse length, and the substrate temperature, the number of laser exposures, the silicon and dielectric materials, the selection of seed metal, and thermal properties of the glass substrate.

With proper control of the annealing process, low temperature glass is not damaged during laser annealing because the laser energy is absorbed at the silicon channel surface and the see initial surface. The laser annealing method can also be used to prepare devices on high temperature glass.

While the invention has been particularly shown and described with respect to illustrative and preferred embodiments thereof, it will be understood by those skilled in the art that the foregoing and other changes in form, material, and details may be made therein without departing from the spirit and scope of the invention which should be limited only by the scope of the appended claims.

Having thus described our invention, what we claim as new, and desire to secure by Letters Patent is:

1. A method of forming a thin film semiconductor device comprising the steps of:
   (a) forming over a glass layer a tri-layer structure having a layer of amorphous silicon sandwiched between bottom and top dielectric layers;
   (b) selectively etching said top dielectric layer to expose portions of said amorphous silicon layer;
   (c) forming a metal seed layer over said exposed portions of said amorphous silicon layer; and
   (d) transforming portions of said amorphous silicon layer to polysilicon using localized laser annealing in the area of the exposed portions of the amorphous silicon layer.

2. The method of claim 1, wherein said tri-layer forming step forms said tri-layer over a glass having a strain temperature, and wherein said annealing step anneals at a temperature exceeding said strain temperature but does not liquify the amorphous silicon layer.

3. The method of claim 1, wherein the laser annealing step comprises one or several exposures.

4. The method of claim 1 including the step of maintaining the glass substrate at a temperature below its strain temperature.

5. The method of claim 1 after said selectively etching step, further comprising the step of furnace annealing prior to said step of forming a metal seed layer.

6. The method of claim 1, wherein said selectively etching step comprises the steps of:
   forming mask over portions of said top dielectric layer;
   etching unmasked portions of said top dielectric layer; and
   removing said mask.

7. The method of claim 1, after said selectively etching step, further comprising forming a heavily doped silicon layer over said exposed portions of said amorphous silicon layer, prior to said step of metal seed layer forming step.

8. The method of claim 7 before said step of forming the heavily doped silicon layer, further comprising the step of furnace annealing.

9. The method of claim 1, after said laser annealing step, further comprising the steps of:
   using a second mask to define a metal area; and
   etching portions of the metal and silicon layers not covered by the mask.

10. The method of claim 9, before said step of forming the tri-layer structure, forming a gate layer over said glass layer.

11. The method of claim 9 further comprising the steps of:
    after laser annealing step forming an insulating layer over said metal layer and said top layer; and
    forming a gate layer over said insulating layer.

12. The method of claim 1, wherein said metal seed layer comprises one of nickel, titanium and palladium.

13. A method of crystallizing an amorphous silicon layer formed over a glass layer having a strain temperature, comprising the steps of:
    forming a metal layer over said amorphous silicon layer; and
    annealing said metal and amorphous silicon layers at a temperature exceeding the strain temperature of the glass layer by using a laser to cause localized heating of said metal layer and portions of the silicon layer to crystallize said amorphous silicon layer without melting the silicon layer and without damaging said glass.

14. A method of forming a plurality of thin film semiconductor devices on a common substrate comprising the steps of:
    (a) sequentially forming over a glass layer a dielectric layer, an amorphous silicon layer, a heavily doped silicon layer, and a metal layer;
    (b) patterning said amorphous silicon, heavily doped silicon, and metal layers;
    (c) patterning said patterned heavily doped silicon and metal layers to form source and drain contacts for the thin film semiconductor devices, separated by an exposed portion of said amorphous silicon layer; and
    (d) selectively annealing said amorphous silicon layer with a laser in the areas patterned for the thin film semiconductor devices.

15. The method of claim 14, including performing the following steps after the laser annealing step:
    forming a gate dielectric layer over said exposed amorphous silicon portion and said source and drain contacts; and
    forming a gate over said gate dielectric layer.

16. The method of claim 14, including the step of forming a gate over said substrate before the sequentially forming step.

17. The method of claim 16, wherein the gate forming step comprises forming a gate layer over said substrate; and patterning said gate layer to form said gate.

18. The method of claim 14 including annealing said metal and amorphous silicon at a temperature exceeding the strain temperature without melting the silicon layer and damaging the glass layer by localizing the heating to the patterned areas by the localized annealing.

* * * * *